US008853062B2

(12) United States Patent
Okumura

(10) Patent No.: US 8,853,062 B2
(45) Date of Patent: Oct. 7, 2014

(54) LASER CRYSTALLIZATION APPARATUS AND LASER CRYSTALLIZATION METHOD USING THE APPARATUS

(75) Inventor: Hiroshi Okumura, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 356 days.

(21) Appl. No.: 13/411,276

(22) Filed: Mar. 2, 2012

(65) Prior Publication Data

US 2013/0092668 A1   Apr. 18, 2013

(30) Foreign Application Priority Data

Oct. 18, 2011 (KR) .......................... 10-2011-0106535

(51) Int. Cl.
*H01S 3/10*     (2006.01)
*B23K 26/00*    (2014.01)
*H01L 31/18*    (2006.01)

(52) U.S. Cl.
CPC ........ *B23K 26/0042* (2013.01); *H01L 31/1872* (2013.01); *B23K 26/00* (2013.01); *H01S 3/10* (2013.01); *H01L 31/186* (2013.01); *B23K 26/0081* (2013.01)
USPC ........ 438/487; 438/795; 250/503.1; 359/618; 219/121.61; 219/121.73; 219/121.75

(58) Field of Classification Search
CPC ..... H01S 3/10; H01L 31/186; H01L 31/1872; B23K 26/00
USPC ............... 438/166, 487, 308, 795; 250/492.1, 250/492.2, 492.22, 492.23, 503.1; 359/618; 219/121.61, 121.62, 121.65, 121.66, 219/121.73, 121.75; 117/200, 201, 204
See application file for complete search history.

(56) References Cited

U.S. PATENT DOCUMENTS

| | | | |
|---|---|---|---|
| 6,650,480 B2 * | 11/2003 | Tanaka .......................... 359/618 |
| 7,615,722 B2 * | 11/2009 | Govorkov et al. ....... 219/121.65 |
| 2004/0069751 A1 * | 4/2004 | Yamazaki et al. ......... 219/121.6 |
| 2005/0169330 A1 | 8/2005 | Hongo et al. |
| 2007/0295974 A1 | 12/2007 | Fontanella et al. |
| 2009/0314755 A1 | 12/2009 | Chung |
| 2010/0221898 A1 | 9/2010 | Nishida et al. |

FOREIGN PATENT DOCUMENTS

| | | |
|---|---|---|
| JP | 2004-093837 | 3/2004 |
| JP | 2004-241421 | 8/2004 |
| JP | 2006-148086 | 6/2006 |
| JP | 4021135 | 10/2007 |
| JP | 2009-186660 | 8/2009 |
| KR | 2020000001470 U | 1/2000 |
| KR | 1020010064139 | 7/2001 |
| KR | 1020080031659 | 4/2008 |
| KR | 1020080103390 | 11/2008 |

* cited by examiner

*Primary Examiner* — Samuel M Heinrich
(74) *Attorney, Agent, or Firm* — Innovation Counsel LLP

(57) ABSTRACT

A laser crystallization device includes a first light source providing a first light and a second light source providing a second light. The device further includes a first lens set receiving the first light to generate a first transmitted light, the first transmitted light having a first profile, the first profile having a first profile error portion and a first non-error portion. The device further includes a second lens set receiving the second light to generate a second transmitted light, the second transmitted light having a second profile, the second profile having a second profile error portion and a second non-error portion, the second profile error portion corresponding to the first non-error portion, the second non-error portion corresponding to the first profile error portion. The device further includes an optical system combining the first transmitted light with the second transmitted light.

19 Claims, 3 Drawing Sheets

LASER CRYSTALLIZATION APPARATUS AND LASER CRYSTALLIZATION METHOD USING THE APPARATUS

CROSS-REFERENCE TO RELATED APPLICATION

This application claims priority to and the benefit of Korean Patent Application No. 10-2011-0106535 filed in the Korean Intellectual Property Office on Oct. 18, 2011, the entire contents of which are incorporated herein by reference.

BACKGROUND (a) Technical Field

The present invention relates to a laser crystallization device and a laser crystallization method.

(b) Description of the Related Art

Liquid crystal displays (LCDs) and organic light emitting diode (OLED) displays, which are flat panel display devices, can be fabricated to be thin and light. Therefore, they are commonly used in mobile electronic devices and are increasingly used in large-scale display devices. As requirements for display devices with high speed operational characteristics emerge, research for such display devices is actively ongoing. In order to implement the high speed operational characteristics of a display device, a channel region of a thin film transistor (TFT) must be formed by using polycrystalline silicon instead of amorphous silicon. Amorphous silicon typically has electrical mobility of about 0.1 cm/Vsec to 0.5 cm/Vsec. In contrast, Polycrystalline silicon typically has electrical mobility of about 100 cm/Vsec to 300 cm/Vsec, thereby enabling a faster operational speed than amorphous silicon.

An annealing method using a laser is one of conventional methods for forming polycrystalline silicon. The annealing method involves irradiating a high energy laser beam to an amorphous silicon thin film deposited on a glass substrate. Upon receiving the laser beam, the amorphous silicon thin film is melted by the heat and then solidifies to be crystallized. This method is advantageous in that the glass substrate is not damaged by the heat.

In the laser crystallization method, energy distribution of an output laser beam, which generally has a Gaussian distribution, is changed by using an optical system. That is, in order to enhance uniformity and productivity of crystallization, the output laser beam is transformed into a linear laser beam, which is long in one direction, before being irradiated to the amorphous silicon thin film.

As a glass substrate to form the liquid crystal display is large, high laser output energy is required. Since the output of a light source is limited, a technique of combining the laser provided by a plurality of light sources has been developed. However, if the laser is combined, a speckle due to interference is generated such that a profile error portion is generated. If a laser beam profile is combined by using the same optical system, the profile error portion becomes even more serious. The profile error portion typically causes non-uniformity of the laser crystallization, which typically causes a display error of the display device.

The above information disclosed in this Background section is only for enhancement of understanding of the background of the invention. The Background may contain information that does not form the prior art that is already known in this country to a person of ordinary skill in the art.

SUMMARY

An embodiment of the present invention is related a laser crystallization device that may minimize profile error portions in a combined laser beam and/or a combined light.

The laser crystallization device may include a first light source unit configured to provide a first light and a second light source unit configured to provide a second light. The device may further include a first lens set configured to receive the first light to generate a first transmitted light, the first transmitted light having a first profile, the first profile having a first profile error portion and a first non-error portion. The device may further include a second lens set configured to receive the second light to generate a second transmitted light, the second transmitted light having a second profile, the second profile having a second profile error portion and a second non-error portion. The device may further include an optical system configured to combine the first transmitted light with the second transmitted light with the second profile error portion being combined with the first non-error portion and with the second non-error portion being combined with the first profile error portion. A position of the second profile error portion corresponds to a position of the first non-error portion, a position of the second non-error portion corresponds to a position of the first profile error portion.

In one or more embodiments, the first profile or the second profile may have a Gaussian distribution.

In one or more embodiments, a light refraction unit in the first lens set may have a first pitch, a light refraction unit in the second lens set may have a second pitch, and the first pitch may be equal to the second pitch.

In one or more embodiments, a light refraction unit in the first lens set may have a first pitch, a light refraction units in the second lens set may have a second pitch, and the first pitch may be different from the second pitch.

In one or more embodiments, the first lens set or the second lens set may include one or more cylindrical lenses.

In one or more embodiments, a first portion of the first lens set may correspond to a first portion of the second lens set, a second portion of the first lens set may correspond to a second portion of the second lens set, the second portion of the first lens set is different from the first portion of the first lens set, the second portion of the second lens set is different from the second portion of the first lens set, the first lens set may receive the first light at the first portion of the first lens set, and the second lens set may receive the second light at the second portion of the second lens set.

In one or more embodiments, an output level of the first light source unit may be equal to an output level of the second light source unit.

In one or more embodiments, the first lens set may include more light refraction units than the second lens set.

In one or more embodiments, a light refraction unit of the first lens set may be wider than a light refraction unit of the second lens set.

In one or more embodiments, the first lens set may receive the first light at a light refraction unit of the first lens set, the second lens set may receive the second light at a light refraction unit of the second lens set, and light refraction unit of the first lens set is not aligned with light refraction unit of the second lens set when an edge of the first lens set is aligned with an edge of the second lens set.

In one or more embodiments, the first profile may include a first plurality of profile error portions, the second profile may include a second plurality of profile error portions, and the first plurality of profile error portions may be offset with respect to the second plurality of profile error portions when the optical system combines the first transmitted light with the second transmitted light.

An embodiment of the present invention is related a laser crystallization method using a combined laser beam and/or a combined light with minimum profile error portions.

The method may include transmitting a first light through a first lens set to generate a first transmitted light, the first transmitted light having a first profile, the first profile having a first profile error portion and a first non-error portion. The method may further include transmitting a second light through a second lens set to generate a second transmitted light, the second transmitted light having a second profile, the second profile having a second profile error portion and a second non-error portion. The method may further include combining, using an optical system, the first transmitted light with the second transmitted light to generate a combined light with the second profile error portion being combined with the first non-error portion and with the second non-error portion being combined with the first profile error portion. The method may further include irradiating the combined light to a silicon member, such as an amorphous silicon film. A position of the second profile error portion corresponds to a position of the first non-error portion, a position of the second non-error portion corresponds to a position of the first profile error portion.

In one or more embodiments, the first profile or the second profile may have a Gaussian distribution.

In one or more embodiments, a light refraction unit in the first lens set may have a first pitch, a light refraction unit in the second lens set may have a second pitch, and the first pitch may be equal to the second pitch.

In one or more embodiments, a light refraction unit in the first lens set may have a first pitch, a light refraction unit in the second lens set may have a second pitch, and the first pitch may be different from the second pitch.

In one or more embodiments, the first lens set or the second lens set may include one or more cylindrical lenses.

In one or more embodiments, a first portion of the first lens set may correspond to a first portion of the second lens set, a second portion of the first lens set may correspond to a second portion of the second lens set, the second portion of the first lens set is different from the first portion of the first lens set, the second portion of the second lens set is different from the second portion of the first lens set, and the method may further include: receiving the first light at the first portion of the first lens set; and receiving the second light at the second portion of the second lens set.

In one or more embodiments, the first lens set may include more light refraction units than the second lens set.

In one or more embodiments, a light refraction unit of the first lens set may be wider than a light refraction unit of the second lens set.

According to one or more embodiments of the present invention, an energy difference of between a profile error portion and a non-error portion in a combined laser beam or a combined light may be minimized. Advantageously, polycrystalline silicon formed using the combined laser beam or the combined light may have high uniformity.

DETAILED DESCRIPTION OF THE EMBODIMENTS

Figure 1:
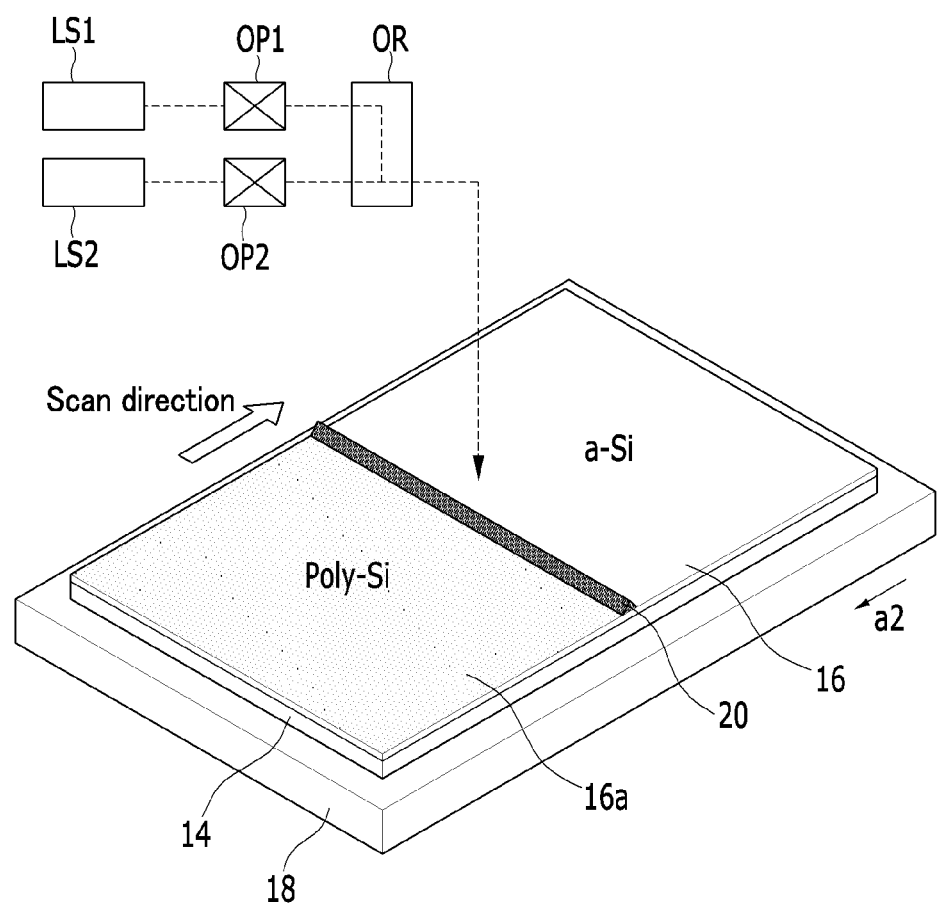
FIG. 1 is a schematic perspective view illustrating a laser crystallization device according to an embodiment of the present invention.

Example embodiments of the present invention will be described in detail with reference to the accompanying drawings. However, the present invention is not limited to embodiments described herein, and may be embodied in other forms. Embodiments described herein are provided so that the disclosed contents may be thoroughly and completely understood and to sufficiently transfer the ideas of the present invention to a person of ordinary skill in the art.

In drawings, the thickness of layers and regions may be exaggerated for clarity. It is to be noted that when a layer is referred to as being "on" another layer or substrate, it can be directly formed on another layer or substrate or can be formed on another layer or substrate through a third layer interposed therebetween. Like constituent elements may be denoted by like reference numerals throughout the specification.

FIG. 1 is a schematic perspective view illustrating a laser crystallization device according to an embodiment of the present invention.

Referring to FIG. 1, a laser crystallization device according to the present embodiment includes a plurality of light source units LS1 and LS2, a plurality of lens arrays OP1 and OP2, an optical system OR for combining a plurality of laser beams, and a transferring stage 18.

A substrate 14 formed with an amorphous silicon thin film 16 is fixed on the transferring stage 18, and the amorphous silicon thin film 16 is irradiated by a laser beam 20 that has a line-shaped coverage and is generated in the laser crystallization device according to the present embodiment.

A position of the laser beam 20 is fixed and the transferring stage 18 is moved in the first direction a2. The laser beam 20 scans the amorphous silicon thin film 16 in a scan direction opposite to the first direction a2 through the movement of the transferring stage 18 and is irradiated to the amorphous silicon thin film 16. The amorphous silicon of an irradiated region 16a is melted and is changed into polycrystalline silicon through a solidification process.

Although details of the optical system OR is not shown, the optical system OR includes a plurality of mirrors to change the energy distribution and direction of laser beams for irradiating the combined laser beam 20 to the substrate 14.

A laser beam provided by a conventional optical system may have a beam profile including a profile error portion. The profile error portion means a non-uniform portion such as a peak that is present on a flat energy intensity profile having a constant value. The profile error portion may be caused by the non-uniformity of each of the lenses forming a lens array, one or more gaps between the lenses, and/or diffraction in the gap(s). Identical profile error portions are typically formed in beam profiles of laser beams that are generated from a plurality of identical light source units and pass through identical lens arrays and identical optical systems. If the laser beams are combined, a beam profile with a reinforced profile error portion may be generated. Embodiments of the present invention, such as those described with reference to FIG. 2 and FIG. 3, may solve the problem.

Figure 2:
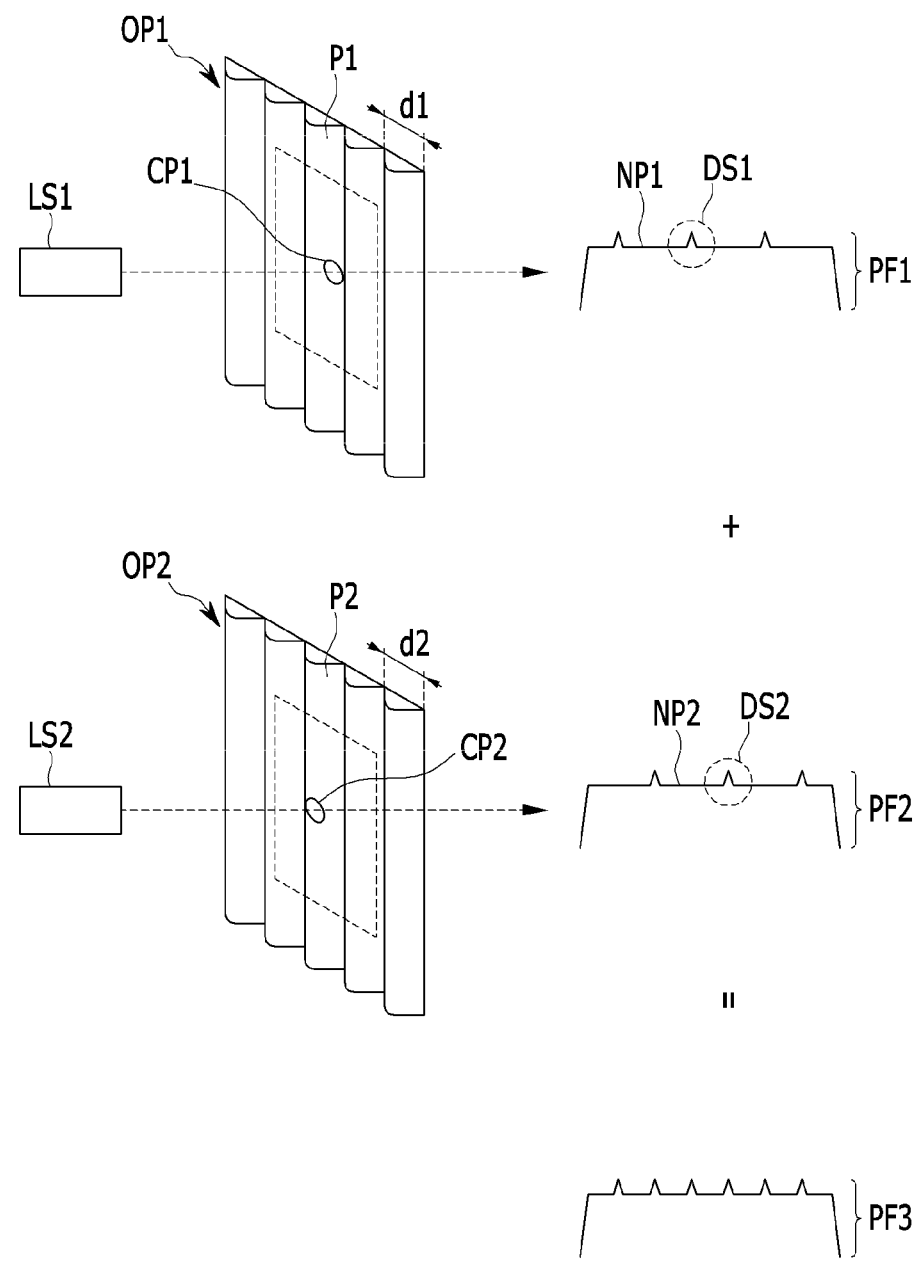
FIG. 2 is a schematic diagram illustrating a method of combining laser beams using the laser crystallization device illustrated in the example of FIG. 1 according to an embodiment of the present invention.

FIG. 2 is a schematic diagram illustrating a method of combining laser beams using the laser crystallization device illustrated in the example of FIG. 1 according to an embodiment of the present invention.

Referring to FIG. 1 and FIG. 2, each lens array according to the present embodiment includes a cylindrical lens (or lens that focuses light which passes through on to a line) or a fly-eye lens (i.e., an array of smaller lenses designed to provide even illumination). The laser crystallization device according to the present embodiment includes a first lens array OP1 through which the laser beam generated from the first light source unit LS1 passes and a second lens array OP2 through which the laser beam generated from the second light source unit LS2 passes. The laser crystallization device (including a beam homogenizer) divides, inverts, and recombines the laser beams using the lens arrays (cylindrical lens array, fly-eye lens, etc.).

The first lens array OP1 has a plurality of light refraction units P1, and the second lens array OP2 has a plurality of light refraction units P2. The light refraction units P1 and P2 have a cylindrical lens shape in which peaks and valleys are alternately and repeatedly formed along a direction perpendicular to a leading direction of the laser beam. Here, the light refraction units P1 and P2 respectively have a first width d1 and a second width d2. In one or more embodiments, the first width d1 may be equal to the second width d2.

The output level of the first light source unit LS1 may be identical to the output level of the second light source unit LS2.

The first laser beam generated from the first light source unit LS1 and the second laser beam generated from the second light source unit LS2 each may have a Gaussian distribution, and the respective maximum intensity is present in each of the center portion of the first laser beam and the center portion of the second laser beam. As illustrated in the example of FIG. 2, a position where the center portion of the first laser beam passes through the first lens array OP1 is referred to as the first passing point (or first passing portion) CP1, and a position where the center portion of the second laser beam passes through the second lens array OP2 is referred to as the second passing point (or second passing portion) CP2. In one or more embodiments, the relative position of the first passing point CP1 relative to the corresponding light refraction unit P1 is different from the relative position of the second passing point CP2 relative to the corresponding light refraction unit P2. For example, when viewing in the direction that the laser beam is progressed, the first passing point CP1 is positioned at the right side relative to the peak portion of one light refraction unit P1, and the second passing point CP2 is positioned at the left side relative to the peak portion of one light refraction unit P2. This is one example in which the corresponding positions for the first passing point CP1 and the second passing point CP2 are different in the light refraction units P1 and P2; variations of different positions can be implemented according to various embodiments of the invention.

As an example, the first laser beam passing through the first lens array OP1 (or referred to as the first lens-transmitted laser beam) has the first profile PF1 with profile error portions DS1, and the second laser beam passing through the second lens array OP2 (or referred to as the second lens-transmitted laser beam) has the second profile PF2 with profile error portions DS2. Because of the different passing points, the relative positions of the profile error portions DS1 in the first profile PF1 are different from the relative positions of the profile error portions DS2 in the second profile PF2. The energy difference between each of the profile error portions DS1 and a non-error portion NP1 of the first profile PS1 is controlled to be less than 3% of the non-error portion NP1 of the first profile PS1, and the energy difference between each of the profile error portions DS2 and a non-error portion NP1 of the second profile PS2 is controlled to be less than 3% of the non-error portion NP2 of the second profile PS2, so as to not affect the laser crystallization. The optical system OR may combine the laser beam having the first profile PF1 (or the first lens-transmitted laser beam) and the laser beam having the second profile PF2 (or the second lens-transmitted laser beam) to generate a combined laser beam having a third profile PF3 as illustrated in the example of FIG. 2.

According to the present embodiment, the profile error portions DS1 in the first profile PF1 are offset with respect to the profile error portions DS2 in the second profile PF2. As a result, the profile error portions DS1 are combined with non-error portions NP2 of the second profile PF2 but are not combined with the profile error portions DS2 in the third profile PS3 of the combined laser beam. Advantageously, a laser beam with high energy but without substantially intensified profile error portions may be generated. In contrast, according to conventional methods, the profile error portions DS1 and DS2 are generated at the same relative positions in the first profile PF1 and the second profile PF2 and are combined. In the combined profile resulted from the conventional methods, the energy difference between a resulted profile error portion and a non-error portion may be more than 5% of the non-error portion; as a result, there may be substantial non-uniformity in the produced polycrystalline silicon, causing display errors in display devices that include the polycrystalline silicon.

Figure 3:
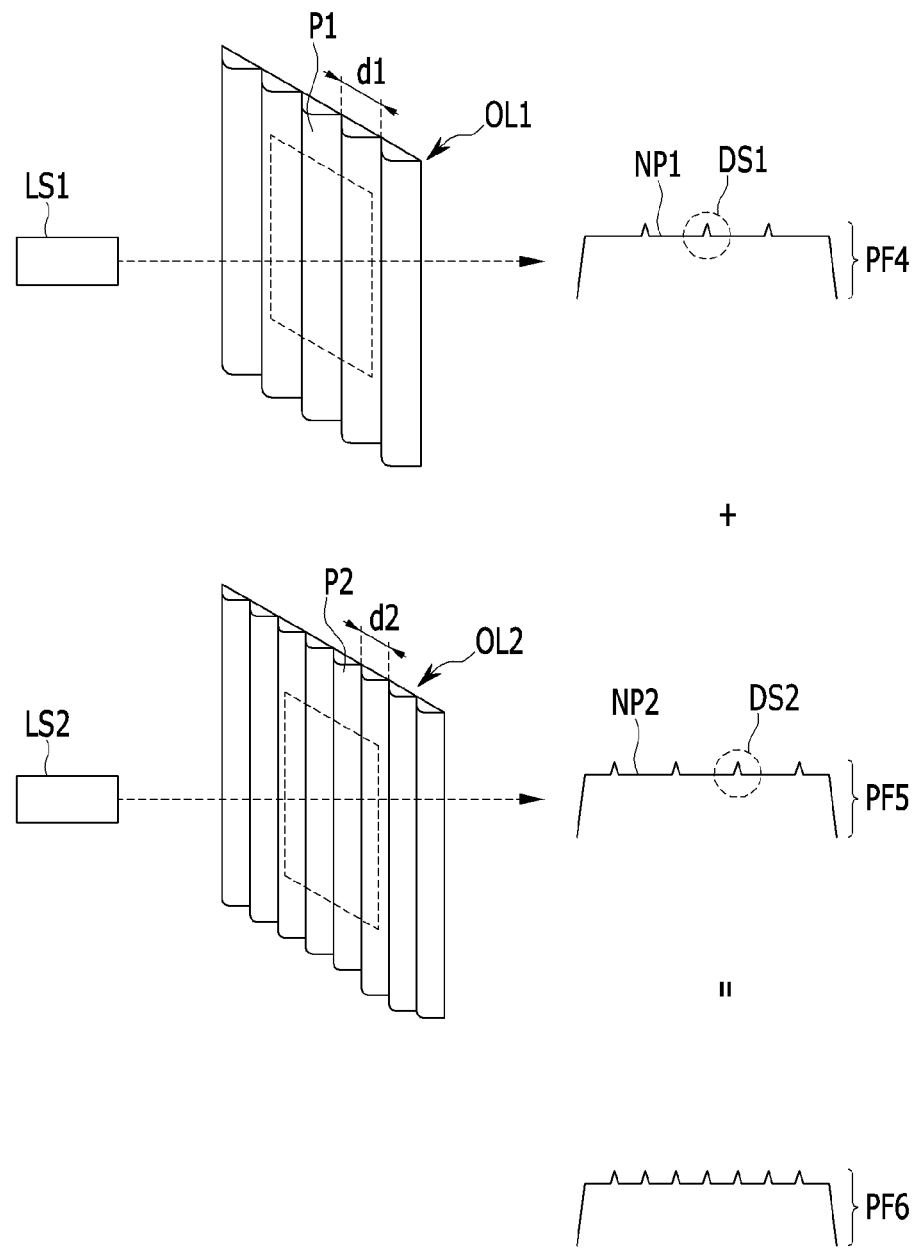
FIG. 3 is a schematic diagram illustrating a method of combining laser beams using a laser crystallization device according to an embodiment of the present invention.

FIG. 3 is a schematic diagram illustrating a method of combining a laser beam using a laser crystallization device according to an embodiment of the present invention.

Referring to FIG. 3, a laser crystallization device according to an embodiment includes the first lens array OP1 through which the laser beam generated from the first light source unit LS1 passes and the second lens array OP2 through which the laser beam generated from the second light source unit LS2 passes. The first lens array OP1 includes a plurality of light refraction units P1, and the second lens array OP2 includes a plurality of light refraction units P2. The light refraction units P1 and P2 respectively have a cylindrical lens shape in which peaks and valleys are alternately and repeatedly formed along a direction perpendicular to a leading direction of the laser beam. Here, the light refraction units P1 and P2 respectively have a first width d1 and a second width d2. In one or more embodiments, the first width d1 may be different from the second width d2. For example, d1 may be greater than d2. In one or more embodiments, the number of light refraction units P2 of the second lens array OP2 may be more than the number of light refraction units P1 of the first lens array OP1.

The output level of the first light source unit LS1 may be identical to the output level of the second light source unit LS2.

The first laser beam generated from the first light source unit LS1 and the second laser beam generated from the second light source unit LS2 each may have a Gaussian distribution, and the respective maximum intensity is present in each of the center portion of the first laser beam and the center portion of the second laser beam.

In the present embodiment, the pitch of the first light refraction units P1 is different from the pitch of the second light refraction units P2, such that the profiles of the laser beams passing through the lens arrays OP1 and OP2 are different, wherein a pitch is the distance between a point on one light refraction unit and the corresponding point on an adjacent light refraction unit. As an example, the first laser beam passing through the first lens array OP1 (or first lens-transmitted laser beam) forms a fourth profile PF4 with profile error portions DS1, and the second laser beam passing through the second lens array OP2 (or second lens-transmitted laser beam) forms a fifth profile PF5 with profile error portions DS2. Because of the different pitches, the positions of the profile error portions DS1 do not correspond to the positions of profile error portions DS2. The optical system OR may combine the laser beam having the fourth profile PF4 (or first lens-transmitted laser beam) and the laser beam having the fifth profile PF5 (or second lens-transmitted laser beam) to generate a combined laser beam having a sixth profile PF6 illustrated in the example of FIG. 3. The profile error portions DS1 are combined with non-error portions NP2 of the fifth profile PF5, and the profile error portions DS2 are combined with non-error portions NP1 of the fourth profile PF4. The profile errors portions are not combined with each other, and therefore are not substantially intensified.

According to the present embodiment, the profile error portions are combined with each other, and therefore are not intensified. Advantageously, a laser beam with high energy and with minimum profile error intensity may be generated.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

| <Description of Symbols> | |
|---|---|
| 14: substrate | 16: amorphous silicon thin film |
| 18: transferring stage | 20: laser beam |
| LS1, LS2 light source unit | |
| OP1, OP2 lens array | |
| OR optical system | |

What is claimed is:

1. A laser crystallization device comprising:
a first light source unit configured to provide a first light;
a second light source unit configured to provide a second light;
a first lens set configured to receive the first light to generate a first transmitted light, the first transmitted light having a first profile, the first profile having a first profile error portion and a first non-error portion;
a second lens set configured to receive the second light to generate a second transmitted light, the second transmitted light having a second profile, the second profile having a second profile error portion and a second non-error portion; and
an optical system configured to combine the first transmitted light with the second transmitted light with the second profile error portion being combined with the first non-error portion and with the second non-error portion being combined with the first profile error portion,
wherein a position of the first profile error portion corresponds to a position of the second non-error portion, a position of the second error portion corresponds to a position of the first profile non-error portion.

2. The laser crystallization device of claim 1, wherein the first profile or the second profile has a Gaussian distribution.

3. The laser crystallization device of claim 1, wherein
a light refraction units in the first lens set has a first pitch,
a light refraction units in the second lens set has a second pitch, and
the first pitch is equal to the second pitch.

4. The laser crystallization device of claim 1, wherein
a light refraction units in the first lens set has a first pitch,
a light refraction units in the second lens set has a second pitch, and
the first pitch is different from the second pitch.

5. The laser crystallization device of claim 1, wherein
the first lens set or the second lens set includes a cylindrical lens.

6. The laser crystallization device of claim 1, wherein:
a first portion of the first lens set corresponds to a first portion of the second lens set,
a second portion of the first lens set corresponds to a second portion of the second lens set,
the second portion of the first lens set is different from the first portion of the first lens set,
the second portion of the second lens set is different from the second portion of the first lens set,
the first lens set receives the first light at the first portion of the first lens set, and
the second lens set receives the second light at the second portion of the second lens set.

7. The laser crystallization device of claim 1, wherein
an output level of the first light source unit is equal to an output level of the second light source unit.

8. The laser crystallization device of claim 1, wherein the first lens set includes more light refraction units than the second lens set.

9. The laser crystallization device of claim 1, wherein a light refraction unit of the first lens set is wider than a light refraction unit of the second lens set.

10. The laser crystallization device of claim 1, wherein
the first lens set receives the first light at a light refraction unit of the first lens set,
the second lens set receives the second light at a light refraction unit of the second lens set, and
light refraction unit of the first lens set is not aligned with light refraction unit of the second lens set when an edge of the first lens set is aligned with an edge of the second lens set.

11. The laser crystallization device of claim 1, wherein
the first profile includes a first plurality of profile error portions,
the second profile includes a second plurality of profile error portions, and
the first plurality of profile error portions is offset with respect to the second plurality of profile error portions when the optical system combines the first transmitted light with the second transmitted light.

12. A laser crystallization method comprising:
transmitting a first light through a first lens set to generate a first transmitted light, the first transmitted light having a first profile, the first profile having a first profile error portion and a first non-error portion;
transmitting a second light through a second lens set to generate a second transmitted light, the second transmitted light having a second profile, the second profile having a second profile error portion and a second non-error portion;
combining, using an optical system, the first transmitted light with the second transmitted light to generate a combined light with the second profile error portion being combined with the first non-error portion and with the second non-error portion being combined with the first profile error portion; and irradiating the combined light to a silicon member, wherein a position of the first profile error portion corresponding to a position of the second non-error portion, a position of the second error portion corresponding to a position of the first profile non-error portion.

13. The laser crystallization method of claim 12, wherein:
the first profile or the second profile has a Gaussian distribution.

14. The laser crystallization method of claim 12, wherein
a light refraction unit in the first lens set has a first pitch,
a light refraction unit in the second lens set has a second pitch, and
the first pitch is equal to the second pitch.

15. The laser crystallization method of claim 12, wherein
a light refraction unit in the first lens set has a first pitch,
a light refraction unit in the second lens set has a second pitch, and
the first pitch is different from the second pitch.

16. The laser crystallization method of claim 12, wherein
the first lens set or the second lens set includes a cylindrical lens.

17. The laser crystallization method of claim 12, wherein
a first portion of the first lens set corresponds to a first portion of the second lens set,
a second portion of the first lens set corresponds to a second portion of the second lens set,
the second portion of the first lens set is different from the first portion of the first lens set,
the second portion of the second lens set is different from the second portion of the first lens set, and
the method further comprises:
receiving the first light at the first portion of the first lens set; and
receiving the second light at the second portion of the second lens set.

18. The laser crystallization method of claim 12, wherein
the first lens set includes more light refraction units than the second lens set.

19. The laser crystallization method of claim 12, wherein a
light refraction unit of the first lens set is wider than a light refraction unit of the second lens set.

* * * * *